(12) United States Patent
Krishnaswamy et al.

(10) Patent No.: US 9,306,525 B2
(45) Date of Patent: Apr. 5, 2016

(54) COMBINED DYNAMIC PROCESSING AND SPEAKER PROTECTION FOR MINIMUM DISTORTION AUDIO PLAYBACK LOUDNESS ENHANCEMENT

(71) Applicant: Apple Inc., Cupertino, CA (US)

(72) Inventors: Arvindh Krishnaswamy, San Jose, CA (US); Andrew P. Bright, San Francisco, CA (US); Joseph M. Williams, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 263 days.

(21) Appl. No.: 13/802,131

(22) Filed: Mar. 13, 2013

(65) Prior Publication Data

US 2013/0329894 A1    Dec. 12, 2013

Related U.S. Application Data

(60) Provisional application No. 61/657,632, filed on Jun. 8, 2012.

(51) Int. Cl.
*H03G 11/00* (2006.01)
*H03G 7/00* (2006.01)

(52) U.S. Cl.
CPC .............. *H03G 11/00* (2013.01); *H03G 7/002* (2013.01); *H03G 7/007* (2013.01)

(58) Field of Classification Search
CPC ....... H03G 11/00; H03G 7/007; H03G 7/002; H03G 1/02; H03G 7/00; H03G 5/00; H03G 7/001; H04R 3/007; H04R 3/00; H04R 3/002
USPC ...................... 381/55, 102–104, 106, 107, 98
See application file for complete search history.

(56) References Cited

U.S. PATENT DOCUMENTS

| 7,800,440 | B2* | 9/2010 | Nishimura | 330/85 |
| 8,582,786 | B2* | 11/2013 | Kemmerer et al. | 381/107 |
| 2004/0178852 | A1* | 9/2004 | Neunaber | 330/284 |
| 2008/0056504 | A1* | 3/2008 | Gorges et al. | 381/55 |
| 2011/0182435 | A1* | 7/2011 | Gautama | 381/55 |
| 2011/0228945 | A1* | 9/2011 | Mihelich et al. | 381/59 |
| 2013/0022208 | A1* | 1/2013 | Dhuyvetter | 381/55 |

* cited by examiner

*Primary Examiner* — Vivian Chin
*Assistant Examiner* — David Ton
(74) *Attorney, Agent, or Firm* — Blakely, Sokoloff, Taylor & Zafman LLP

(57) ABSTRACT

Apparatuses, methods, computer readable mediums, and systems are described for combined dynamic processing and speaker protection for minimizing distortion in audio playback. In some embodiments, at least one compressed audio signal is received, at least one threshold for a speaker is retrieved, modifications to audio signal compression are determined based on the at least one compressed audio signal and the at least one threshold, information embodying the modifications is transmitted to a dynamic processor, and using the dynamic processor, at least one modified compressed audio signal is produced for the speaker based on the information.

22 Claims, 6 Drawing Sheets

COMBINED DYNAMIC PROCESSING AND SPEAKER PROTECTION FOR MINIMUM DISTORTION AUDIO PLAYBACK LOUDNESS ENHANCEMENT

CROSS-REFERENCE TO RELATED PROVISIONAL APPLICATION

This application claims the benefit of U.S. Provisional Patent Application No. 61/657,632 filed on Jun. 8, 2012, the disclosure of which is hereby incorporated herein by reference in its entirety.

BACKGROUND

In audio playback systems, users often desire audio to be played back with an increased volume. Dynamic compression may be applied to audio signals to amplify the sound in audio playback systems. Dynamic compression may be implemented with Dynamic Range Compression (DRC) algorithms. DRC algorithms amplify sounds by compressing the dynamic range of an audio signal. A possible side effect from compression of the audio signal using a DRC compression algorithm is that the audio signal can become distorted. The amplified audio signal may also drive up the voltage and/or create too much energy for the speakers of an audio playback system to handle.

As a precautionary measure, audio playback systems may utilize protection software or hardware to monitor and modify audio signals to prevent the speakers from experiencing harmful thermal conditions or displacement issues presented by the audio signals. Either attenuating the audio signal and/or filtering lower frequency bands can modify audio signals. Protection software operates as a last resort/failsafe mechanism to prevent speakers from melting and/or causing any other harm to the speaker.

When precautionary measures are applied to the audio signal that has been compressed using DRC, the resulting audio signal from the audio system may be a soft, distorted signal. As such, there is a need to improve audio playback systems that use dynamic compression.

SUMMARY

Apparatuses, methods, computer readable mediums, and systems are described for combined dynamic processing and speaker protection for minimizing distortion in audio playback. In some embodiments, at least one compressed audio signal is received, at least one threshold for a speaker is retrieved, modifications to audio signal compression are determined based on the at least one compressed audio signal and the at least one threshold, information embodying the modifications is transmitted to a dynamic processor, and using the dynamic processor, at least one modified compressed audio signal is produced for the speaker based on the information.

BRIEF DESCRIPTION OF THE FIGURES

The above and other objects and advantages of the invention will be apparent upon consideration of the following detailed description, taken in conjunction with the accompanying drawings, in which like reference characters refer to like parts throughout, and in which.

DETAILED DESCRIPTION OF THE PREFERRED EMBODIMENTS

Apparatuses, methods, computer readable mediums, and systems for combined dynamic processing and speaker protection to minimize distortion in audio playback are described. Embodiments may provide the ability for speaker protection modules/circuitry and dynamic processors to work in conjunction, cooperate, and/or communicate to enable processing of audio signals with optimal quality and loudness appropriate for at least one speaker. In some embodiments, speaker protection functionality may be incorporated into dynamic processors.

Speaker protection modules may provide protection information to dynamic processors to serve as guidance for audio signal compression that is appropriate for at least one speaker. Protection information may indicate whether modifications to audio signals, such as attenuation and/or filtering of audio signals, are desirable for a speaker of an audio playback system. Dynamic processors can compress audio signals in accordance with protection information to produce compressed audio signals with optimal sound quality for the speaker and refrain from damaging the speaker.

In some embodiments, the dynamic processor used to produce, process, and/or compress audio signals appropriate for at least one speaker may use protection parameters. Protection information may provide guidance on compression by indicating to set, adjust, and/or assign values to one or more protection parameters used by the dynamic processors in compression of audio signals. Protection parameters that are accessed during compression indicate desired modifications and/or thresholds for audio compression, and the parameters can be accessed by dynamic processors to ensure that compression of audio signals is appropriate for the speaker. Protection parameters may indicate thresholds and/or limits for compression of audio signals so as to minimize distortion during playback and reduce or eliminate the modification of audio signals by last resort/failsafe stand-alone protection circuitry.

Figure 1:
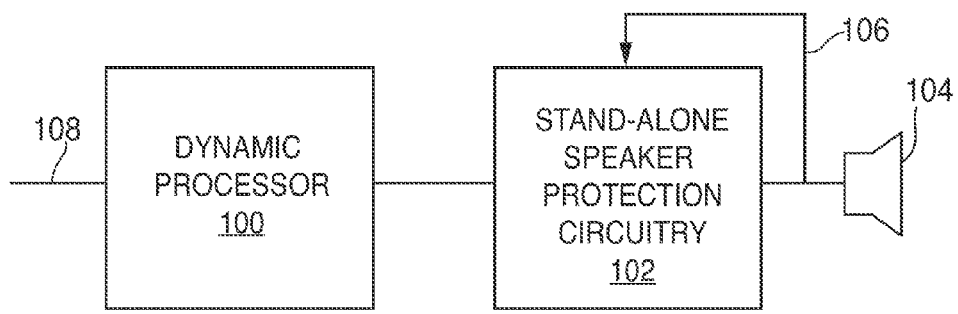
FIG. 1 is a block diagram of a conventional system having dynamic processing and stand-alone speaker protection.

FIG. 1 is a block diagram of a conventional system having dynamic processing and stand-alone speaker protection. Dynamic processor 100 may receive an audio signal and compress audio data for the audio signal to increase the volume. Dynamic processor 100 may be implemented to use a DRC algorithm to amplify sounds in an effort to increase the volume or to give the perception of increased volume. For example, given a maximum amplitude for an audio playback system, dynamic processor 100 may compress the audio signals to amplify the signals as much as possible without exceeding the maximum amplitude. The amplification of signals using compression may be harmful to sound quality and/or to the speaker itself. For example, a side effect of the application of the compression algorithm to audio signals is that the signals can become distorted. As another example, the amplified audio signals may also drive up the voltage and/or boost energy for the audio signals, which may be harmful to the speaker.

Stand-alone speaker protection circuitry 102 may be an implementation of failsafe software or hardware for the protection of speaker 104. Speaker 104 can be damaged if it receives signals that have too much energy (which can result in thermal damage), or the speaker 104 has an excessively strong response to lower frequency bands (which can cause displacement issues). Stand-alone speaker protection circuitry 102 monitors and alters the audio signals prior to being received by speaker 104 to ensure that the signals provided by dynamic processor 102 will not result in damage to speaker 104. For example, stand-alone speaker protection circuitry 102 may receive voltage and current information for the audio signals and perform calculations to determine whether the audio signals with the voltage and current would be harmful to a speaker.

Stand-alone speaker protection circuitry 102 may monitor audio signals sent to the speaker and alter them to protect speaker 104 from damage. Stand-alone speaker protection circuitry 102 may alter the audio signals for thermal issues by attenuating the signals. For displacement issues, the stand-alone speaker protection circuitry 102 may filter out lower frequency bands using a pass through filter and/or by suppressing lower frequency bands.

Approaches to implementing speaker protection can be predictive models (i.e., open loop implementation) that modify audio signals in anticipation that the signals will harm the speaker. For example, stand-alone speaker protection circuitry 102 may receive audio signals over path 108 and predict possible harm to speaker 104. Stand-alone speaker protection circuitry 102 can modify audio signals before speaker 104 receives them over path 108.

Alternatively, an adaptive approach (i.e., closed loop implementation) for stand-alone speaker protection circuitry 102 may be used to modify audio signals. In an adaptive approach, audio signals may be modified after receipt of feedback from speaker 104. For example, feedback from speaker 104 may be received by stand-alone speaker protection circuitry 102 as shown over the path 106. Speaker 104 feedback may indicate to attenuate and/or filter low band frequencies and stand-alone speaker protection circuitry 102 may modify the audio signals to protect speaker 104.

Stand-alone speaker protection circuitry 102 may cause audio signals that have been compressed using DRC to be attenuated in order to protect a speaker. Due to the distortion side effect introduced during compression, the attenuation of compressed audio signals can result in playback of soft, distorted audio signals. As such, in FIG. 1, the stand-alone speaker protection circuitry 102 and dynamic processor 100 units operate as competing processes, where dynamic processor 100 amplifies audio signals and stand-alone speaker protection circuitry 102 attenuates the compressed and distorted audio signals.

Figure 2:
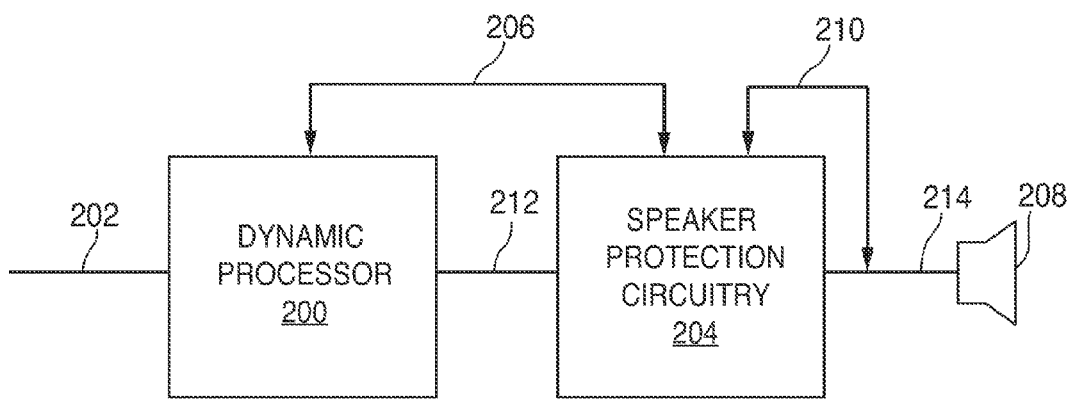
FIG. 2 is an illustrative block diagram showing combined dynamic processing and speaker protection in accordance with an embodiment.

FIG. 2 is an illustrative block diagram showing combined dynamic processing and speaker protection in accordance with an embodiment. Dynamic processor 200 works in conjunction with speaker protection circuitry 204 to produce audio signals for speaker 208. Dynamic processor 200 and speaker protection circuitry 204 may be implemented as software, one or more hardware components, or any combination thereof. For example, dynamic processor 200 and speaker protection circuitry 204 may be application specific integrated circuits (ASIC). In another example, speaker protection circuitry 204 and dynamic processor 200 may be implemented as software modules.

Dynamic processor 200 may receive audio signals over path 202 and may compress the audio signals. Dynamic processor 200 may provide the compressed audio signals to speaker protection circuitry 204 over path 212. Speaker protection circuitry 204 may determine whether the received compressed audio signals need to be modified, and/or overall compression by dynamic processor 200 needs to be modified for speaker 208. For example, speaker protection circuitry 204 may perform any number of calculations to determine whether compressed audio signals exceed or will exceed thresholds for speaker 208 and/or may be modified to produce audio signals for the speaker 208 with optimal sound quality.

Speaker protection circuitry 204 may access stored thresholds for speaker 208, may use feedback from speaker 208 to determine thresholds, may predict and/or calculate thresholds for speaker 208, and/or use any other method for determining speaker 208 thresholds. Using thresholds for speaker 208, speaker protection circuitry 204 may determine if received compressed audio signals are potentially harmful to speaker 208 or if sound quality may be improved for speaker 208, and may then determine any number of modifications to compression to improve audio signals received by speaker 208 over path 214.

In some embodiments, data on steps for processing audio signals to produce compressed audio signals may be used by speaker protection circuitry 204 to determine modifications to compression. For example, parameters used by dynamic processor 200 during compression and/or steps in processing of audio signals may be communicated to speaker protection circuitry 204 over path 206 and used to determine any modifications to compression by dynamic processor 200. Continuing with the example, maximum amplitude used during compression may be communicated to speaker protection circuitry 204 and used as a factor in determining whether modifications to compression by dynamic processor 200 are beneficial, such as whether the maximum amplitude exceeds a threshold for speaker 208. In another example, types of steps and ordering of steps in processing, such as when gains are applied during compression, may be used as factors in determining whether modifications to compression are needed.

Modifications can include attenuations, filtering, and/or any other modifications to compressed audio signals to protect speaker 208. Speaker protection circuitry 204 may send protection information over path 206 to dynamic processor 200 indicating any desired modifications to compression of audio signals, such as speaker thresholds. For example, speaker protection circuitry 204 may send protection information that indicates thresholds and/or limits (e.g., energy and amplitude limits) to dynamic processor 200. Protection information may be data that indicates results from calculations, suggested modifications to audio signals, data on expected or predicted attenuations, data on filtering limits that may be performed to protect speaker 208, and/or any other information that may be beneficial for compression of audio signals by dynamic processor 200 for speaker 208.

Protection information may be calculated or determined by speaker protection circuitry 204 regarding preferred modifications for audio signals in order to protect speaker 208. For example, speaker protection circuitry 204 can access and/or calculate the energy and amplitude thresholds and/or any other thresholds for speaker 208. Speaker protection circuitry 204 may perform calculations relying on feedback data received from the speaker 208 and/or data received while monitoring audio signals to determine preferred modifications thereto. In some embodiments, protection information may be in the form of feedback data from speaker 208 (e.g., voltage and current threshold data) received by the speaker protection circuitry 204 over path 210 while monitoring the audio signal 202, and dynamic processor 200 can use feedback to guide compression of audio signals, such as using threshold data received as feedback from speaker 208 to set compression parameters.

Dynamic processor 200 may compress audio signals in accordance with protection information received from speaker protection circuitry 204. Dynamic processor 200 may receive protection information from the speaker protection circuitry 204 using path 206. Dynamic processor 200 may determine or retrieve a protection parameter for dynamic compression from protection information. For example, protection information may indicate attenuation of audio signals that may be desirable to protect speaker 208. Dynamic processor 200 may set a protection parameter that limits the amplification of the audio signals, such that attenuation may effectively be performed upfront by dynamic processor 200. Continuing with the example, protection information may indicate a protection parameter of a maximum amplitude for compression of audio signals and dynamic processor 200 may compress audio signals with the given maximum amplitude.

In another example, protection information may indicate that it would be desirable for lower frequency bands to be filtered out of the audio signals. A protection parameter may be set to indicate lower frequencies should be filtered out. In this example, dynamic processor 200 may filter out the low frequency bands upfront and prior to applying compression algorithms to the audio signals.

Dynamic processor 200 may split the audio signals into multiple bands and make adjustments to each band in accordance with protection parameters. Protection parameters may indicate gains may be applied to one or more bands, limits for one or more bands, whether lower level frequency bands should be removed, attenuations to be performed on one or more bands, and/or any other parameters to prepare audio signals for compression by dynamic processor 200.

In some embodiments, the ordering of steps may be communicated to speaker protection circuitry 204 (e.g., when gains are applied) and speaker protection circuitry 204 may determine modifications to the ordering of steps for compression of audio signals in protection information sent to dynamic processor 200. For example, DRC algorithms, implemented in dynamic processor 200, may compress audio signals and later apply a gain thereto after compression. With such implementations, it may be desirable to have dynamic processor 200 instead apply gains to the audio signals before compression. Continuing with the example, dynamic processor 200 may be implemented to compress and/or boost the energy for the audio signals in a first stage. And, in a second stage, dynamic processor 200 may limit and/or attenuate the audio signals in accordance with the protection information from speaker protection circuitry 204.

Speaker protection circuitry 204 may perform as a failsafe protection of speaker 208, such as offering functionality of stand-alone speaker protection 102 of FIG. 1, by monitoring and altering audio signals on path 212. Speaker protection circuitry 204 may log data on audio signals received by speaker 208, such as calculations for modifications to audio signals and/or any other data on audio signals received. Although not depicted, pre-processing and post-processing of dynamically compressed audio signals may be performed.

Figure 3:
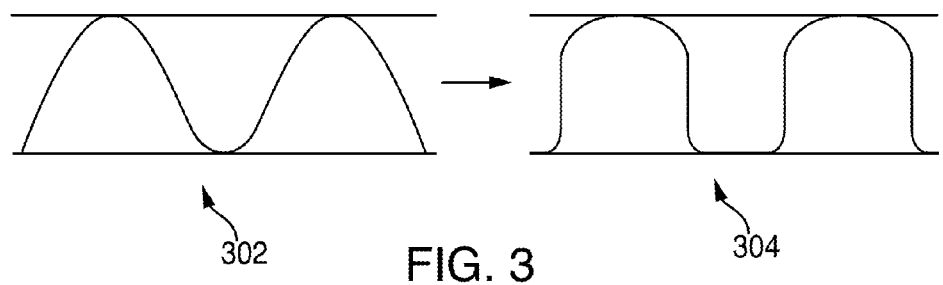
FIG. 3 is an illustrative diagram of audio signal waveforms in accordance with an embodiment.

FIG. 3 is an illustrative diagram of audio signal waveforms in accordance with an embodiment. As shown in FIG. 3, an original sine wave or sinusoidal waveform 302 can be compressed using DRC to have a square wave or nearly square wave 304 (which has more energy). It may be desirable to think of the audio signal output from a DRC as audio signals that have received an energy boost. By having dynamic processor 200 and speaker protection circuitry 204 cooperate, audio signals can receive an energy boost in accordance with thresholds for speaker 208, and the audio signals may limit and/or eliminate the need for failsafe, last resort speaker protection circuitry 204 to operate as a competing process for dynamic processor 200 by modifying compressed audio signals further.

Figure 4:
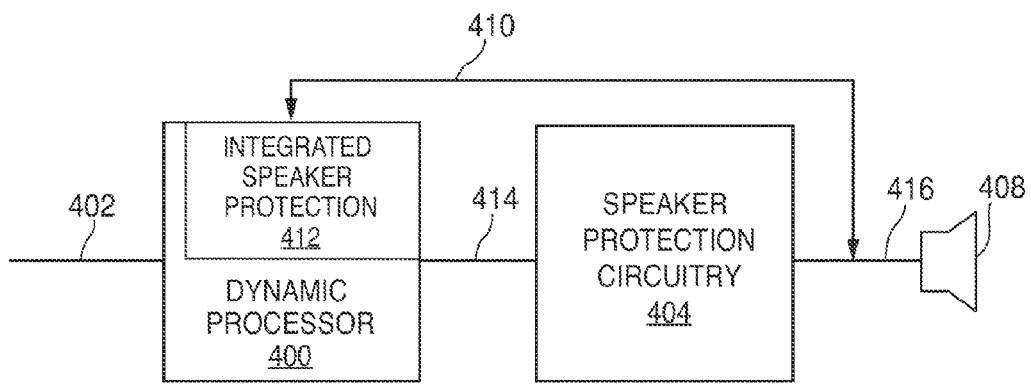
FIG. 4 is an illustrative block diagram showing integrated dynamic processing and speaker protection implemented in combination with stand-alone speaker protection in accordance with an embodiment.

FIG. 4 is an illustrative block diagram showing integrated dynamic processing and speaker protection implemented in combination with stand-alone speaker protection in accordance with an embodiment. Dynamic processor 400 is implemented with integrated speaker protection, as shown with integrated speaker protection 412, to compress audio signals received on path 402. Integration of speaker protection may eliminate the need for a path between speaker protection circuitry 404 and dynamic processor 400/integrated speaker protection 412, thereby allowing protection information to be easily provided to dynamic processor 400. Integrated speaker protection 412 may be implemented as software, hardware, or any combination thereof. For example, integrated speaker protection 412 may be a software module designed to communicate protection information (e.g., set protection parameters) to dynamic processor 400, which controls application of compression algorithms.

Integrated speaker protection 412 may receive protection information, such as feedback from speaker 408 or calculated thresholds for a speaker over path 410, and/or protection information from speaker protection circuitry 404. Integrated speaker protection 412 may handle any portion of the calculations and/or decisions performed to determine modifications to audio signals that ensure protection of speaker 408.

Integrated speaker protection 412 may set protection parameters using protection information and dynamic processor 400 may process audio signals in accordance with the parameters. Integrated speaker protection 412 may set and/or check values for parameters any number of times to ensure at least one speaker is protected. For example, integrated speaker protection 412 may set parameters continuously or periodically, at device/system startup, and/or at any other scheduled times.

Dynamic processor 400 may compress audio signals received over path 402 in accordance with protection parameters. For example, dynamic processor 400 may implement any modifications to compression by adjusting parameters accessed during compression. Compressed audio signals may then be received by speaker 408 over path 416.

Speaker protection circuitry 404 may be stand-alone speaker protection circuitry that is a last resort, failsafe for speaker 408. In some embodiments, integrated dynamic processor 400 and integrated speaker protection 412 may make adjustments to audio signals upfront, such that speaker protection circuitry 404 functionality to alter compressed audio signals may not be invoked. In the event that adjustments made with integrated dynamic processor 400 and integrated speaker protection 412 are not sufficient, speaker protection circuitry 404 may protect the speaker 408 by modifying audio signals received over path 414. Speaker protection circuitry 404 may log information regarding compression of audio signals for speaker 408.

Figure 5:
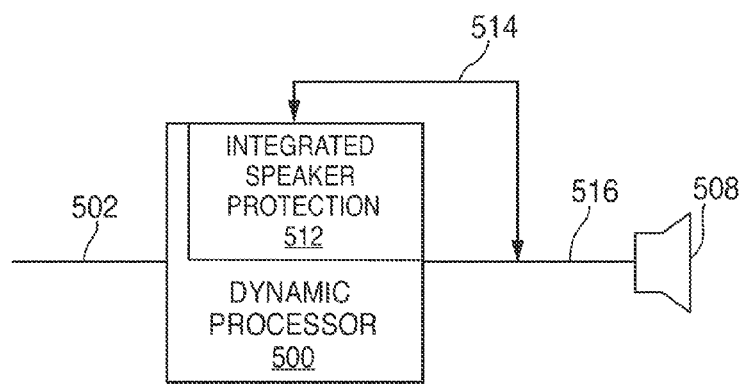
FIG. 5 is an illustrative block diagram with an implementation of integrated dynamic processing and speaker protection in accordance with an embodiment.

FIG. 5 is an illustrative block diagram with an implementation of integrated dynamic processing and speaker protection in accordance with an embodiment. Dynamic processor 500 has integrated speaker protection 512 to determine modifications to compression applied to audio signals received over path 502 and received by speaker 508 over path 516. In some embodiments, integrated speaker protection 512 may be a software module accessible by dynamic processor 500. Integrated speaker protection 512 may have an interface for receiving feedback from speaker 508 and communicating with dynamic processor 500. Modifications to compression provided by integrated speaker protection 512 to dynamic processor 500 may offer guidance on producing compressed audio signals that enhance loudness of audio provided by speaker 508, minimize distortion of audio provided by speaker 508, protect speaker 508, and/or optimize sound quality provided by speaker 508 with audio signals received over path 516.

In some embodiments, integrated speaker protection 512 may eliminate the need to rely on failsafe, last resort stand-alone speaker protection 102 that operates as a competing process to dynamic processors. By eliminating stand-alone speaker protection 102 and relying on integrated speaker protection 512 for guidance on modifications to compression, speaker 508 may produce optimal sound quality with compressed audio signals from dynamic processor 500.

To determine modifications to compression, integrated speaker protection 512 may receive from dynamic processor 500 data on compression of audio signals received over path 502 and/or compressed audio signals produced by dynamic processor 500 with audio signals received over path 502. Data on compression from dynamic processor 500 may be parameters or thresholds used by dynamic processor 500 in compression of audio signals, steps of processes or algorithms used to produce compressed audio signals by dynamic processor 500, and/or any other data on compression of audio signals received over path 502. For example, dynamic processor 500 may indicate when a gains step is applied during compression and/or a maximum amplitude parameter used during compression of audio signals with dynamic processor 500. Compressed audio signals and/or data on compression of audio signals produced by dynamic processor 500 may be used by integrated speaker protection 512 to determine any modifications to compression of audio signals received over path 502.

Integrated speaker protection 512 may retrieve thresholds for speaker 508 to determine whether any modifications to compression of audio signals would be beneficial for speaker 508. Thresholds for speaker 508 may be provided by a manufacturer of speaker 508, learned from prior experiences with speaker 508, predicted by integrated speaker protection 512, and/or determined using any other method by speaker protection 512. Integrated speaker protection 512 may use machine learning to anticipate thresholds for speaker 508 and/or any other method for predicting thresholds for speaker 508. Optionally, integrated speaker protection 512 may receive feedback from speaker 508 over path 514 on thresholds for speaker 508. In some embodiments, integrated speaker protection 512 may calculate thresholds for speaker 508 using any specifications provided to integrated speaker protection 512 on speaker 508.

Using retrieved thresholds for speaker 508 and compressed audio signals and/or data on compression by dynamic processor 500, integrated speaker protection 512 may determine any number of modifications to compression by dynamic processor 500. Integrated speaker protection 512 may perform calculations to determine whether compressed audio signals produced by dynamic processor 500 exceed thresholds for speaker 508. For example, calculations may be performed to determine whether the energy levels produced by the compressed audio signals exceed a threshold for the speaker 508.

In some embodiments, integrated speaker protection 512 may determine from data on compression that thresholds for a speaker 508 are exceeded. Integrated speaker protection 512 may determine modifications to compression, such as modifications parameters used during compression, steps performed during compression, and/or when steps are performed. For example, a maximum amplitude parameter used by dynamic processor 500 may exceed a threshold for speaker 508 and a limiting step applied after compression with the amplitude parameter may not be adequate to prevent compressed audio signals produced by dynamic processor from harming speaker 508. Continuing with the example, integrated speaker protection 512 may determine modifications to compression that may be beneficial for speaker 508, such as adjusting the maximum amplitude, increasing limits used in a limiting step, and/or eliminating a gains step applied after the limiting step.

Protection information indicating modifications determined by integrated speaker protection 512 may be communicated to dynamic processor 500. In some embodiments, protection information may indicate no modifications are necessary. Dynamic processor 500 may use protection information to determine parameters for compression, steps in processing audio signals, and/or when to apply steps in processing audio signals. Protection information may indicate specific modifications to compression of audio signals and/or indicate that modifications should be made by dynamic processor 500 to avoid exceeding a particular threshold for speaker 508. Dynamic processor 500 may compress audio signals in accordance with protection information from integrated speaker protection 512.

In an embodiment, dynamic processor 500 may use thresholds determined or retrieved by integrated speaker protection 512 as parameters for compression of audio signals. In such embodiments, compression and analysis of compressed audio signals by integrated speaker protection 512 may not be necessary because dynamic processor 500 may compress audio signals in accordance with thresholds for speaker 508 upfront.

Figure 6A:
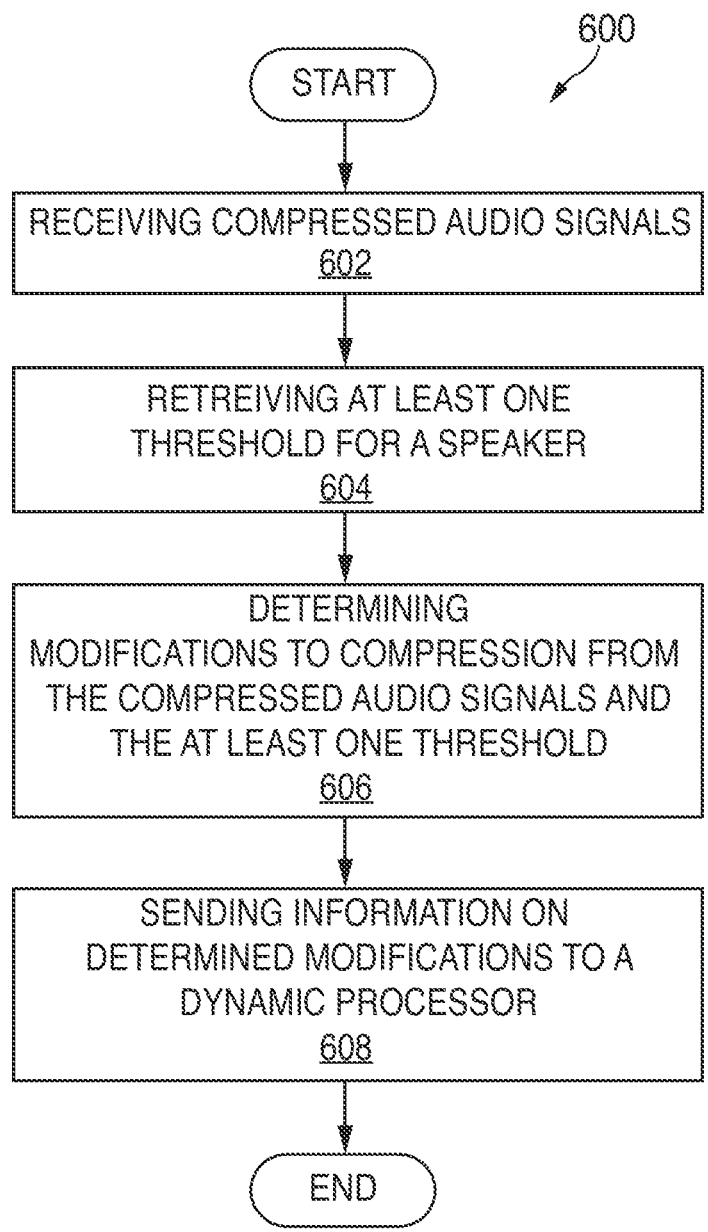
FIG. 6A is a flowchart illustrating an exemplary process for combined dynamic processing and speaker protection in accordance with an embodiment.

FIG. 6A is a flowchart illustrating an exemplary process 600 for combined dynamic processing and speaker protection in accordance with an embodiment. Initially, compressed audio signals may be received (602). The compressed audio signals may be produced by a dynamic processor and received by a speaker protection module for determining modifications to compression of audio signals received by a speaker. The speaker protection functionality may be integrated into the dynamic processor, such as with a software module accessible to the dynamic processor, and/or a stand-alone speaker protection module in communication with the dynamic processor. The speaker protection module may retrieve at least one threshold for a speaker (604). The speaker protection module can calculate a threshold for a speaker, receive a threshold for a speaker from feedback provided by the speaker, and/or access a stored threshold for the speaker.

The speaker protection module can determine any number of modifications to compression from the compressed audio signals and the at least one threshold (606). In some embodiments, data on compression of audio signals received from the dynamic processor, such as parameters used by the dynamic processor during compression, may be used to determine modifications to compression. The speaker protection module can send protection information on any determined modifications to the dynamic processor (608). The protection information may indicate a threshold for the compressed audio signals, a modification to a processing step or ordering of processing steps for compression of audio signals, and/or any other modification for the compression of audio signals. The dynamic processor can adjust processing of the audio signals to compress them in accordance the modifications.

Figure 6B:
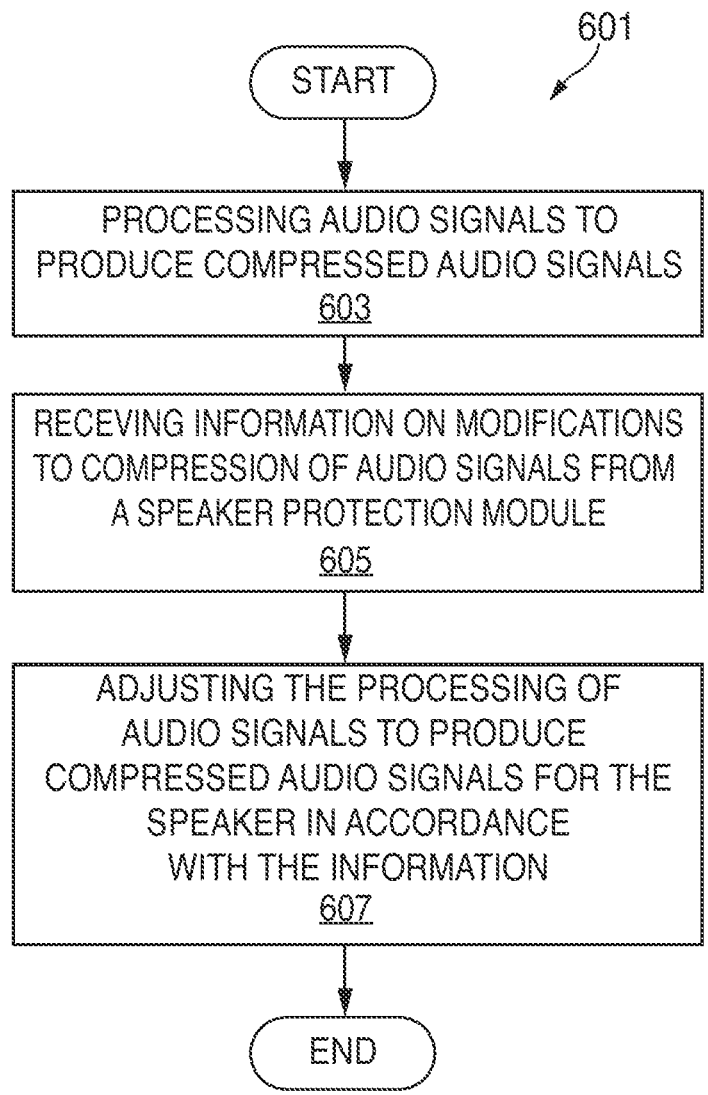
FIG. 6B is a flowchart illustrating an exemplary alternative process for combined dynamic processing and speaker protection in accordance with an embodiment.

FIG. 6B is flowchart illustrating an alternative process 601 for combined dynamic processing and speaker protection in accordance with an embodiment. Initially, the dynamic processor processes audio signals to produce compressed audio signals (603). The dynamic processor may receive information on modifications to compression of audio signals from a speaker protection module (605). The information may indicate a threshold for compression of audio signals, a modification to steps in processing audio signals, and/or any other modification for compression of audio signals. The dynamic processor may adjust processing of audio signals to produce compressed audio signals in accordance with the information (607). For example, a protection parameter (e.g., a maximum amplitude, and/or indication to filter lower frequency bands) may be determined for dynamic compression using the protection information provided by a speaker protection module, and dynamic processor may compress the audio signals using the protection parameter.

Figure 7:
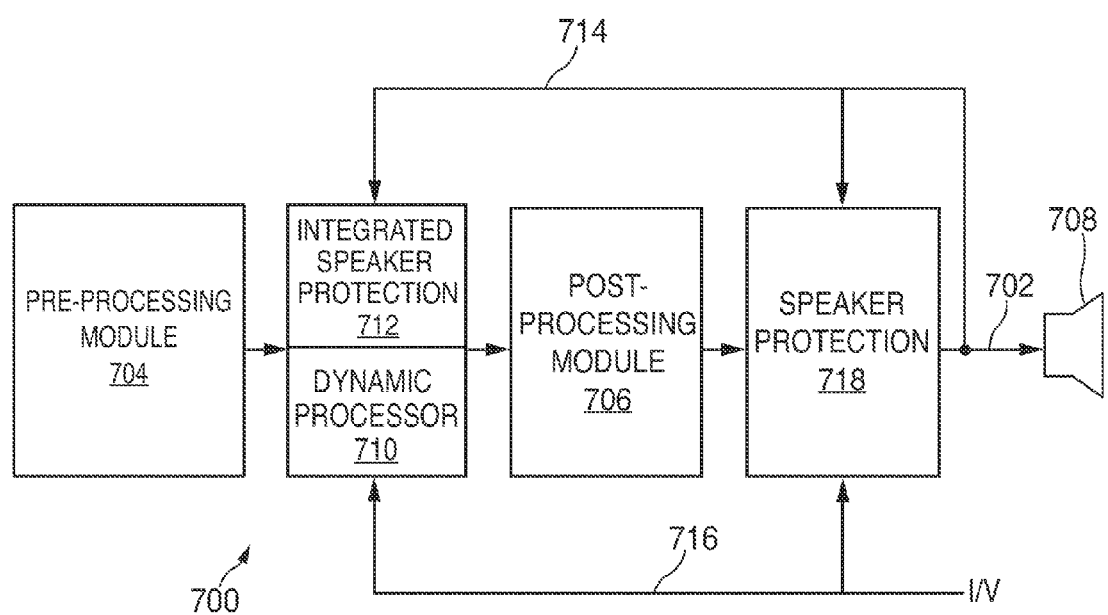
FIG. 7 is a block diagram illustrating an exemplary alternative combined dynamic processing and speaker protection implementation in accordance with an embodiment.

FIG. 7 illustrates an alternative combined dynamic processing and speaker protection implementation in accordance with an embodiment. Audio playback system 700 may use path 702 to send audio signals to speaker 708 for playback. Pre-processing module 704 may perform dynamic compression pre-processing before being received by dynamic processor 710 with integrated speaker protection 712.

Dynamic processor 710 may receive protection information over paths 714 and 716. As shown, path 716 may provide current and voltage information that may be used by integrated speaker protection 712 to calculate protection parameters and/or modifications to compression performed by dynamic processor 710. For example, the current and voltage information may be used to determine modifications to audio signals for speaker 708 to handle displacement issues.

Path 714 may provide protection information, such as temperature information, that may be used by integrated speaker protection 712 to calculate protection parameters and/or modifications to compression performed by dynamic processor 710. Integrated speaker protection 712 may perform any of the functionality as described above in more detail with integrated speaker protection 412 and 512, and/or speaker protection circuitry 204.

Post-processing may be performed by post-processing module 706. Post-processing may be implemented to ensure that gains are not applied to the audio signals produced after compression by dynamic processor 710. Audio signals that are post-processed may be received by speaker protection 718 over path 720. Speaker protection 718 may receive the current, voltage, and temperature protection information and perform calculations to ensure that modifications to protect speaker 708 have been performed. Speaker protection 718 may be a last resort/failsafe protection and modify audio signals to protect speaker 708, and may log audio signal information history.

Figure 8:
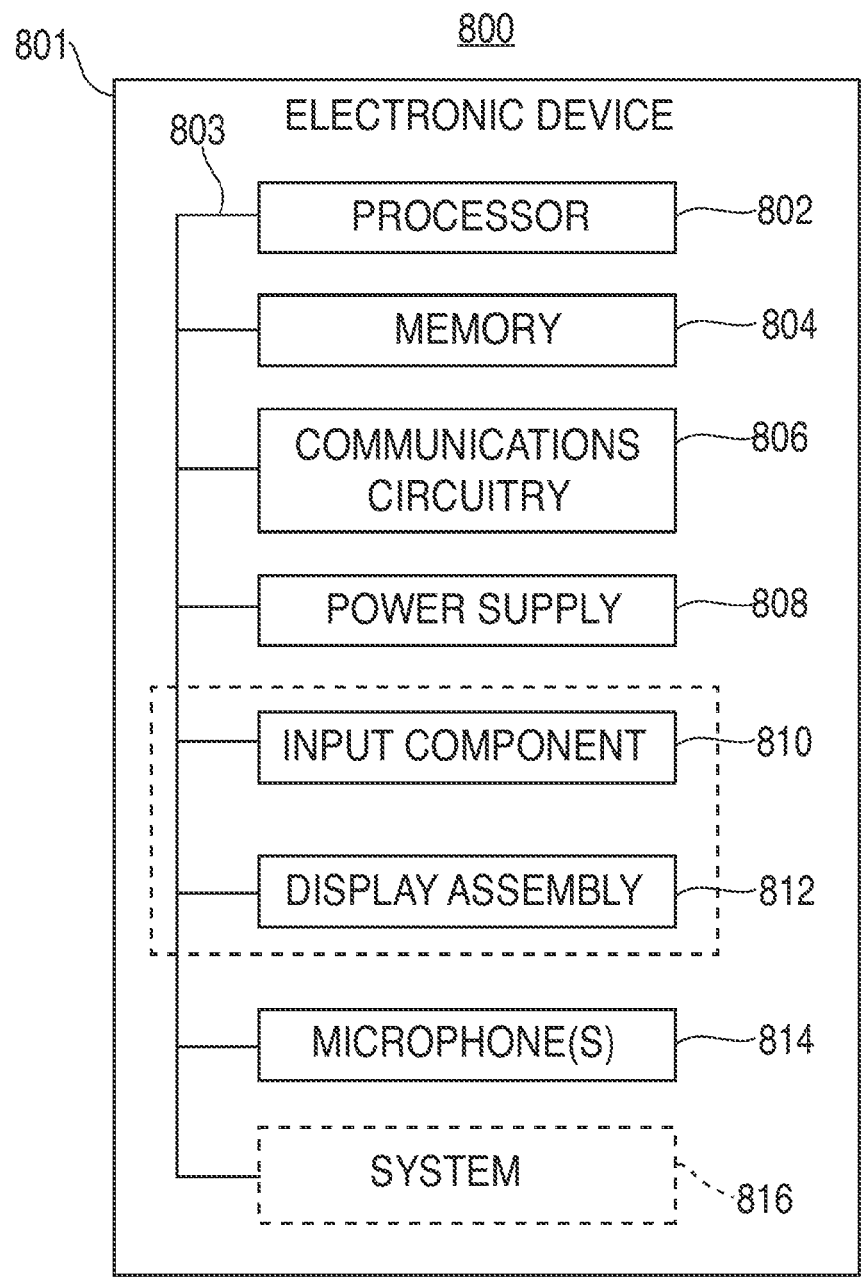
FIG. 8 is a schematic view of an illustrative electronic device in accordance with an embodiment.

FIG. 8 is a schematic view of an illustrative electronic device in accordance with an embodiment. Electronic device 800 may contain one or more of the systems 816 described in FIGS. 2, 4, 5, and 7. Electronic device 800 may be any portable, mobile, or hand-held electronic device configured to present visible information on a display assembly wherever the user travels. Alternatively, electronic device 800 may not be portable at all, but may instead be generally stationary. Electronic device 800 can include, but is not limited to, a music player, video player, still image player, game player, other media player, music recorder, movie or video camera or recorder, still camera, other media recorder, radio, medical equipment, domestic appliance, transportation vehicle instrument, musical instrument, calculator, cellular telephone, other wireless communication device, personal digital assistant, remote control, pager, computer (e.g., desktop, laptop, tablet, server, etc.), monitor, television, stereo equipment, set up box, set-top box, boom box, modem, router, keyboard, mouse, speaker, printer, and combinations thereof. In some embodiments, electronic device 800 may perform a single function (e.g., a device dedicated to displaying image content) and, in other embodiments, electronic device 800 may perform multiple functions (e.g., a device that displays image content, plays music, and receives and transmits telephone calls).

Electronic device 800 may include a housing 801, a processor or control circuitry 802, memory 804, communications circuitry 806, power supply 808, input component 810, display assembly 812, and microphones 814. Electronic device 800 may also include a bus 803 that may provide a data transfer path for transferring data and/or power, to, from, or between various other components of device 800. In some embodiments, one or more components of electronic device 800 may be combined or omitted. Moreover, electronic device 800 may include other components not combined or included in FIG. 8. For the sake of simplicity, only one of each of the components is shown in FIG. 8.

Memory 804 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 804 may include cache memory, which may be one or more different types of memory used for temporarily storing data for electronic device applications. Memory 804 may store media data (e.g., music, image, and video files), software (e.g., for implementing functions on device 800), firmware, preference information (e.g., media playback preferences), lifestyle information (e.g., food preferences), exercise information (e.g., information obtained by exercise monitoring equipment), transaction information (e.g., information such as credit card information), wireless connection information (e.g., information that may enable device 800 to establish a wireless connection), subscription information (e.g., information that keeps track of podcasts or television shows or other media a user subscribes to), contact information (e.g., telephone numbers and e-mail addresses), calendar information, any other suitable data, or any combination thereof.

Communications circuitry 806 may be provided to allow device 800 to communicate with one or more other electronic devices or servers using any suitable communications protocol. For example, communications circuitry 806 may support Wi-Fi™ (e.g., an 802.11 protocol), Ethernet, Bluetooth™, high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any other communications protocol, or any combination thereof. Communications circuitry 906 may also include circuitry that can enable device 900 to be electrically coupled to another device (e.g., a computer or an accessory device) and communicate with that other device, either wirelessly or via a wired connection.

Power supply 808 may provide power to one or more of the components of device 800. In some embodiments, power supply 808 can be coupled to a power grid (e.g., when device 800 is not a portable device, such as a desktop computer). In some embodiments, power supply 808 can include one or more batteries for providing power (e.g., when device 800 is a portable device, such as a cellular telephone). As another example, power supply 808 can be configured to generate power from a natural source (e.g., solar power using one or more solar cells).

One or more input components 810 may be provided to permit a user to interact or interface with device 800. For example, input component 810 can take a variety of forms, including, but not limited to, a track pad, dial, click wheel, scroll wheel, touch screen, one or more buttons (e.g., a keyboard), mouse, joy stick, track ball, and combinations thereof. For example, input component 810 may include a multi-touch screen. Each input component 810 can be configured to provide one or more dedicated control functions for making selections or issuing commands associated with operating device 800.

Electronic device 800 may also include one or more output components that may present information (e.g., textual, graphical, audible, and/or tactile information) to a user of device 800. An output component of electronic device 800 may take various forms, including, but not limited, to audio speakers, headphones, audio line-outs, visual displays, antennas, infrared ports, rumblers, vibrators, or combinations thereof.

For example, electronic device 800 may include display assembly 812 as an output component. Display 812 may include any suitable type of display or interface for presenting visible information to a user of device 800. In some embodiments, display 812 may include a display embedded in device 800 or coupled to device 800 (e.g., a removable display). Display 812 may include, for example, a liquid crystal display ("LCD"), a light emitting diode ("LED") display, an organic light-emitting diode ("OLED") display, a surface-conduction electron-emitter display ("SED"), a carbon nanotube display, a nanocrystal display, any other suitable type of display, or combination thereof. Alternatively, display 812 can include a movable display or a projecting system for providing a display of content on a surface remote from electronic device 800, such as, for example, a video projector, a head-up display, or a three-dimensional (e.g., holographic) display. As another example, display 812 may include a digital or mechanical viewfinder. In some embodiments, display 812 may include a viewfinder of the type found in compact digital cameras, reflex cameras, or any other suitable still or video camera.

It should be noted that one or more input components and one or more output components may sometimes be referred to collectively as an I/O interface (e.g., input component 810 and display 812 as I/O interface 811). It should also be noted that input component 810 and display 812 may sometimes be a single I/O component, such as a touch screen that may receive input information through a user's touch of a display screen and that may also provide visual information to a user via that same display screen.

Processor 802 of device 800 may control the operation of many functions and other circuitry provided by device 800. For example, processor 802 may receive input signals from input component 810 and/or drive output signals to display assembly 812. Processor 802 may load a user interface program (e.g., a program stored in memory 804 or another device or server) to determine how instructions or data received via an input component 810 may manipulate the way in which information is provided to the user via an output component (e.g., display 812). For example, processor 802 may control the viewing angle of the visible information presented to the user by display 812 or may otherwise instruct display 812 to alter the viewing angle.

Microphones 814 can include any suitable number of microphones integrated within device 800. The number of microphones can be one or more.

Electronic device 800 may also be provided with a housing 801 that may at least partially enclose one or more of the components of device 800 for protecting them from debris and other degrading forces external to device 800. In some embodiments, one or more of the components may be provided within its own housing (e.g., input component 810 may be an independent keyboard or mouse within its own housing that may wirelessly or through a wire communicate with processor 802, which may be provided within its own housing).

The above described embodiments of the present invention are presented for purposes of illustration and not of limitation, and the present invention is limited only by the claims.

What is claimed is:

1. A method for combined dynamic processing and speaker protection via an integrated circuit including a speaker protection circuit, the method, comprising:
   accessing, by the speaker protection circuit of the integrated circuit, a storage medium storing a threshold associated with a speaker;
   processing audio signals via the integrated circuit to produce at least one compressed audio signal;
   receiving, from the speaker protection circuit, protection information embodying modifications to audio signal compression, the speaker protection circuit determining the modifications at least in part using the at least one compressed audio signal and the threshold;
   adjusting the processing of the audio signals to produce at least one modified audio signal for the speaker based on the protection information; and
   monitoring the at least one modified audio signal produced by the integrated circuit via a stand-alone speaker protection circuit, wherein the stand-alone speaker protection circuit cooperates with the integrated circuit to process audio.

2. The method of claim 1, further comprising:
   retrieving at least one audio signal compression parameter for processing the audio signals to produce the at least one compressed audio signal;
   adjusting at least one audio signal compression parameter based on the protection information, wherein the protection information includes the threshold associated with the speaker; and
   processing audio signals to produce at least one modified compressed audio signal for the speaker using the at least one audio signal compression parameter.

3. The method of claim 2, wherein the at least one audio signal compression parameter is at least one of an amplitude, a power level, a voltage, an energy level, an attenuation modification, or a filtering modification.

4. The method of claim 1, further comprising:
processing the audio signals to produce the at least one compressed audio signal via a dynamic processor within the integrated circuit;
periodically sending signal compression data representing at least a portion of the audio signal compression performed by the dynamic processor to the speaker protection circuit;
determining the protection information in the speaker protection circuit using the signal compression data; and
receiving, at the dynamic processor from the speaker protection circuit, the protection information embodying modifications to audio signal compression.

5. The method of claim 4, further comprising:
modifying the audio signal compression at the dynamic processor to minimize distortion in the compressed audio signal; and
modifying the compressed audio signal via a stand-alone speaker protection circuit before the signal is received at the speaker in response to a determination that the at least one compressed audio signal is harmful to the speaker.

6. A non-transitory computer readable medium having one or more instructions thereon to perform operations for combined dynamic processing and speaker protection via an integrated circuit including a speaker protection circuit, the operations to minimize distortion and enhance loudness of audio playback for a speaker, wherein the one or more instructions, when executed by one or more processors, cause the one or more processors to perform operations comprising:
accessing, by the speaker protection circuit of the integrated circuit, a storage medium storing a threshold associated with a speaker;
using the integrated circuit to process processing audio signals to produce at least one compressed audio signal;
receiving, from the speaker protection circuit, protection information embodying modifications to audio signal compression, the speaker protection circuit determining the modifications using at least in part the at least one compressed audio signal and the threshold;
adjusting the processing of the audio signals to produce at least one modified audio signal for the speaker based on the protection information; and
monitoring the at least one modified audio signal via a stand-alone speaker protection circuit in cooperation with the speaker protection circuit of the integrated circuit.

7. The non-transitory computer readable medium of claim 6, wherein the one or more processors perform further operations including:
retrieving at least one audio signal compression parameter for processing the audio signals to produce the at least one compressed audio signal;
adjusting at least one audio signal compression parameter based on the protection information, wherein the protection information includes the threshold associated with the speaker; and
processing audio signals to produce at least one modified compressed audio signal for the speaker using the at least one audio signal compression parameter.

8. The non-transitory computer readable medium of claim 7, wherein the at least one audio signal compression parameter is at least one of an amplitude, a power level, a voltage, an energy level, an attenuation modification, and a filtering modification.

9. The non-transitory computer readable medium of claim 6, wherein the one or more processors perform further operations including:
processing the audio signals to produce the at least one compressed audio signal via a dynamic processor within the integrated circuit;
periodically sending signal compression data representing at least a portion of the audio signal compression performed by the dynamic processor to the speaker protection circuit;
determining the protection information in the speaker protection circuit using the signal compression data; and
receiving, at the dynamic processor from the speaker protection circuit, the protection information embodying modifications to audio signal compression.

10. The non-transitory computer readable medium of claim 9, wherein the one or more processors perform further operations including:
modifying the audio signal compression at the dynamic processor to minimize distortion in the compressed audio signal; and
modifying the compressed audio signal via a stand-alone speaker protection circuit before the signal is received at the speaker in response to a determination that the at least one compressed audio signal is harmful to the speaker.

11. An audio processing system for combined dynamic processing and speaker protection, the system comprising:
an integrated circuit coupled to a storage medium storing a threshold associated with a speaker, the integrated circuit including a speaker protection circuit and a dynamic processor, wherein the dynamic processor is to process audio signals to produce a compressed audio signal and further to produce a modified compressed audio signal based on protection information provided by the speaker protection circuit, wherein the speaker protection circuit is to determine the protection information using at least the compressed audio signal and the threshold; and
a stand-alone speaker protection circuit coupled to the integrated circuit and the speaker, the stand-alone speaker protection circuit to monitor the compressed audio signal in cooperation with the speaker protection circuit of the integrated circuit.

12. The system as in claim 11, further comprising a storage medium storing a threshold associated with a speaker.

13. The system as in claim 11, wherein the dynamic processor is to process audio signals to produce the compressed audio signal based on at least one audio signal compression parameter and periodically send signal compression data representing at least a portion of the audio signal compression to the speaker protection circuit.

14. The system as in claim 13, wherein the speaker protection circuit is to receive the signal compression data from the dynamic processor and determine the protection information using the signal compression data.

15. The system as in claim 14, wherein the dynamic processor is further to adjust the processing of the audio signals to produce the modified compressed audio signal by adjusting the at least one audio signal compression parameter based on the protection information.

16. The system as in claim 15, wherein the at least one audio signal compression parameter is at least one of an amplitude, a power level, a voltage, an energy level, an attenuation modification, or a filtering modification.

17. The system as in claim 11, wherein the stand-alone speaker protection circuit is further to modify the compressed audio signal before the signal is received at the speaker in response to a determination that the compressed audio signal is harmful to the speaker.

18. The system as in claim 17, wherein the speaker protection circuit of the integrated circuit is to minimize distortion in the compressed audio signal produced by the dynamic processor and to reduce modification of the compressed audio signal by the stand-alone speaker protection circuit.

19. The system as in claim 18, wherein the stand-alone speaker protection circuit is further to log information regarding the compressed audio signal for the speaker.

20. The system as in claim 11, wherein to produce the modified compressed audio signal, the dynamic processor is further to split the audio signals into multiple frequency bands and adjust each frequency band in accordance with the protection information.

21. The system as in claim 20, wherein the dynamic processor is further to apply a gain to a first frequency band and apply a limit to a second frequency band in accordance with the protection information.

22. The system as in claim 21, wherein the dynamics processor is further to remove a third frequency band in accordance with the protection information.

* * * * *